(12) United States Patent
Chiu et al.

(10) Patent No.: US 7,155,194 B2
(45) Date of Patent: Dec. 26, 2006

(54) MIXER USED IN DIRECT CONVERSION TRANSCEIVER AND RELATED METHOD

(75) Inventors: Chinq-Shiun Chiu, Hsin-Chu (TW); Kuang-Kai Teng, Taipei (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 214 days.

(21) Appl. No.: 10/905,493

(22) Filed: Jan. 6, 2005

(65) Prior Publication Data
US 2006/0148439 A1 Jul. 6, 2006

(51) Int. Cl.
*H04B 1/26* (2006.01)
(52) U.S. Cl. .................. 455/323; 455/313; 455/315; 455/316; 455/318
(58) Field of Classification Search ............. 455/323, 455/325–326, 334, 341, 313, 314–319, 311, 455/254–255, 130–131, 141, 146–147, 151.3, 455/182.1, 190.1, 192.1, 195.1, 196.1, 208–209, 455/216; 327/113; 330/149, 124 R, 151; 375/296
See application file for complete search history.

(56) References Cited

U.S. PATENT DOCUMENTS

| 5,379,457 | A | * | 1/1995 | Nguyen ............... 455/323 |
| 5,920,810 | A | * | 7/1999 | Finol et al. ............ 455/313 |
| 5,933,771 | A | * | 8/1999 | Tiller et al. ............ 455/333 |
| 5,999,804 | A | * | 12/1999 | Forgues ................ 455/333 |
| 6,212,369 | B1 | * | 4/2001 | Avasarala ............. 455/333 |
| 6,233,444 | B1 | | 5/2001 | Nakanishi |
| 6,282,414 | B1 | * | 8/2001 | Tsukuda ............... 455/326 |
| 6,348,830 | B1 | | 2/2002 | Rebeiz et al. |
| 6,360,087 | B1 | | 3/2002 | Rozenblit et al. |
| 6,370,372 | B1 | * | 4/2002 | Molnar et al. ......... 455/323 |
| 6,381,449 | B1 | * | 4/2002 | Yamaji et al. ......... 455/313 |
| 6,529,721 | B1 | * | 3/2003 | Tiller ................... 455/323 |
| 6,606,489 | B1 | * | 8/2003 | Razavi et al. ......... 455/323 |
| 6,687,494 | B1 | * | 2/2004 | Mourant ............... 455/326 |
| 6,711,396 | B1 | * | 3/2004 | Bergsma et al. ....... 455/317 |
| 6,999,745 | B1 | * | 2/2006 | Leenaerts ............. 455/313 |
| 7,075,345 | B1 | * | 7/2006 | Umeda et al. ......... 327/113 |

(Continued)

FOREIGN PATENT DOCUMENTS

DE 100 37 247 A1 2/2002

(Continued)

OTHER PUBLICATIONS

Shuo-Yuan Hsiao et al., "A Parallel Structure for CMOS Four-Quadrant Analog Multipliers and Its Application to a 2-GHz RF Downconversion Mixer," pp. 859-869, IEEE Journal of Solid-State Circuits, vol. 33, No. 6, Jun. 1998.

(Continued)

*Primary Examiner*—Pablo N. Tran
(74) *Attorney, Agent, or Firm*—Winston Hsu

(57) ABSTRACT

A frequency conversion apparatus for converting an input signal having an input frequency into an output signal having an output frequency. The frequency conversion apparatus includes a first multiplier and a gm stage. The first multiplier multiplies a first local signal having a first frequency with a second local signal having a second frequency to generate a differential current signal having a third frequency. The third frequency is substantially the same as the input frequency or the output frequency, and the first frequency and the second frequency are different from the input frequency or the output frequency. The gm stage is electrically connected to the first multiplier and receives the differential current signal and the input signal to generate the output signal.

21 Claims, 4 Drawing Sheets

U.S. PATENT DOCUMENTS 7,088,980 B1 * 8/2006 Otaka .................. 455/323
2002/0163391 A1 11/2002 Peterzell

FOREIGN PATENT DOCUMENTS

DE        101 22 919 A1    9/2002

OTHER PUBLICATIONS

Shen-Iuan Liu et al., "Low-Voltage BiCMOS Four-Quadrant Multiplier Using Triode-Region Transistors," pp. 861-864, IEEE Transactions on Circuits and Systems-I: Fundamental Theory and Applications, vol. 46, No. 7, Jul. 1999.

* cited by examiner

MIXER USED IN DIRECT CONVERSION TRANSCEIVER AND RELATED METHOD

BACKGROUND

This invention relates to mixers, and more particularly, to mixers used in direct conversion transceivers with the local oscillator (LO) self-mixing problem or the LO leakage problem being minimized.

In every kind of receiver or transmitter, mixers are always used for frequency conversion from an RF (radio frequency) to an IF (intermediate frequency) or a BB (baseband), and vice versa. A mixer used in a receiver for down frequency conversion is called a "down mixer"; and a mixer used in a transmitter for up frequency conversion is called an "up mixer". Both up mixer and down mixer have similar structure.

Taking receivers as an example, there are numerous receiver topologies commonly used today. One of which is called a heterodyne receiver (or superheterodyne receiver), which down converts an input signal into a rather high intermediate frequency to generate an IF signal first. Then the IF signal is further filtered, amplified, and down converted again into another lower frequency (typically called a second IF or BB) for demodulation and data reconstruction. It is important that an IF filter must be used in the signal path of the heterodyne receiver, and the using of the IF filter always increases the cost and area of the whole mixer.

A direct conversion receiver (DCR) is another commonly used receiver topology, which substantially generates no IF signals. In other words, a mixer of a DCR converts the RF signals directly into baseband. FIG. 1 shows a block diagram of a conventional double-balanced mixer, which is also referred to as a "Gilbert-Cell", used in a DCR. The double-balanced mixer 100 shown in FIG. 1 includes a current source $I_{BIAS}$, six transistors $Q_1$~$Q_6$, and two resistors $R_1$ and $R_2$. The transistor pair $Q_1$ and $Q_2$ converts an input signal $V_{RF}$ into a differential current signal $I_{DIFF}$. The differential current signal $I_{DIFF}$ includes a first single-ended current signal $I_{DIFF+}$ and a second single-ended current signal $I_{DIFF-}$. With the two resistors $R_1$ and $R_2$ being used as loads, the four transistors $Q_3$~$Q_6$ mix the differential current signal $I_{DIFF}$ with a LO signal $V_{LO}$ to generate an output signal $V_{BB}$.

An advantage of the DCR is that it has a simple circuit layout. Besides, since a DCR avoids the use of IF filters, the cost of using DCR can be much lower than using heterodyne receiver with additional IF filters.

However, a DCR employing the standard mixer (such as the double-balanced mixer 100 shown in FIG. 1) suffers from a technical problem, which is called "LO self-mixing problem". This problem is induced because the frequency of the LO signal used by the mixer is substantially the same as the frequency of the RF signal inputted into the mixer. The LO signal with voltage form might leak into the port of the mixer for receiving the RF signal and then the leaked LO signal will self-mix with the original LO signal during the mixing process. A resulted random DC offset then appears at the output port of the mixer. The random DC offset degrades the baseband signal quality and deteriorate the performance of the DCR.

Similarly, a direct conversion transmitter employing the standard mixer also suffers from a technical problem, which is called "LO leakage problem". This problem is induced because the frequency of the LO signal used by the mixer is substantially the same as the frequency of the RF signal outputted by the mixer. The LO signal with voltage form might leak into the port of the mixer for outputting the RF signal, and then the leaked LO signal will mix with the outputted RF signal. This LO leakage problem declines signal quality of the outputted RF signal.

FIG. 2 shows a subharmonic double-balanced mixer disclosed by Rebeiz, et al. in U.S. Pat. No. 6,348,830. The subharmonic double-balanced mixer 200 shown in FIG. 2 includes a current source $I_{BIAS}$, eight transistors $Q_1$~$Q_8$, and two resistors $R_1$ and $R_2$. The four transistors $Q_1$~$Q_4$ form a LO section 210; with four LO signals having four different phases and a bias current generated by the current source $I_{BIAS}$ being inputted, the LO section 210 generates a differential current signal $I_{DIFF}$. The differential current signal $I_{DIFF}$ includes a first single-ended current signal $I_{DIFF+}$ and a second single-ended current signal $I_{DIFF-}$. The four transistors $Q_5$~$Q_8$ form a RF section 220, with the two resistors $R_1$ and $R_2$ being used as loads, the RF section 220 mixes the differential current signal $I_{DIFF}$ with a RF signal $V_{RF}$ to generate an output signal $V_{BB}$.

The subharmonic double-balanced mixer (such as that shown in FIG. 2) provides a great solution to the abovementioned LO self-mixing problem. The reason is that the frequency of the LO signals used by the subharmonic double-balanced mixer is different from that of the received RF signal. Even if the LO signals mixed with the received RF signal, since these two signals have different frequencies, DC offset problems will not be generated. Similarly, the subharmonic double-balanced mixer also provides a great solution to the abovementioned LO leakage problem. The reason is that the frequency of the LO signals used by the subharmonic double-balanced mixer is different from that of the RF signal generated by the mixer. Even if the LO signals mixed with the outputted RF signal, since these two signals have different frequencies, the leaked LO signal will not influence the signal quality of the outputted RF signal.

SUMMARY OF INVENTION

It is an objective of the claimed invention to provide a mixer used in a direct conversion receiver or a direct conversion transmitter with the LO self-mixing problem or the LO leakage problem being minimized.

According to the claimed invention, a frequency conversion apparatus for converting an input signal having an input frequency into an output signal having an output frequency is disclosed. The frequency conversion apparatus includes a first multiplier and a gm stage. The first multiplier multiplies a first local signal having a first frequency with a second local signal having a second frequency to generate a differential current signal having a third frequency. The third frequency is substantially the same as the input frequency or the output frequency, and the first frequency and the second frequency are different from the input frequency or the output frequency. The gm stage is electrically connected to the first multiplier for receiving the differential current signal and the input signal to generate the output signal.

In addition, according to the claimed invention, a method for converting an input signal having an input frequency into an output signal having an output frequency is also disclosed. The method includes multiplying a first local signal having a first frequency with a second local signal having a second frequency to generate a differential current signal having a third frequency and receiving the differential current signal and the input signal to generate the output signal. The third frequency is substantially the same as the input frequency or the output frequency, and the first frequency and the second frequency are different from the input frequency or the output frequency.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
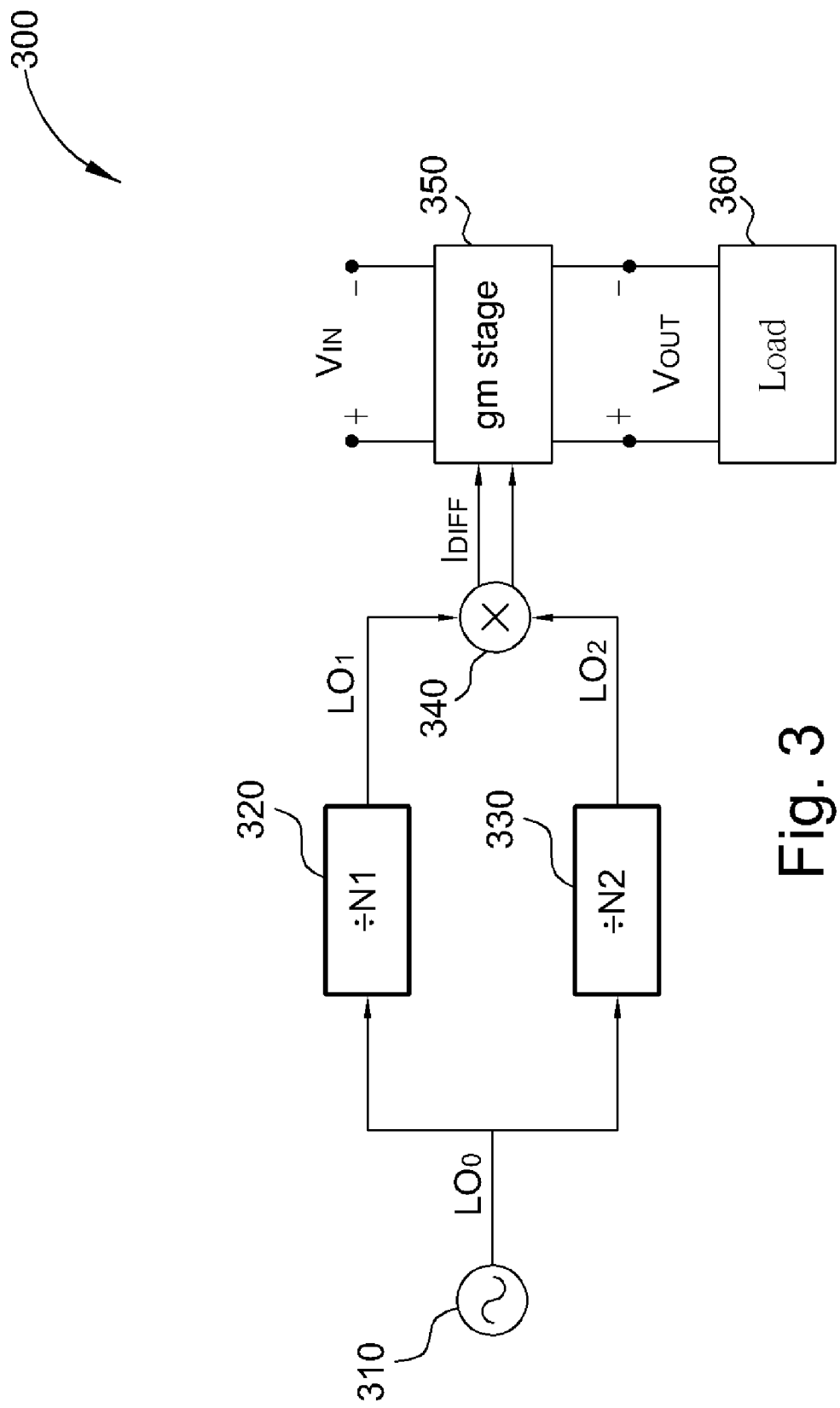
FIG. 3 shows a block diagram of a mixer according to an exemplary embodiment of the present invention.

FIG. 3 shows a block diagram of a mixer according to an exemplary embodiment of the present invention. In this embodiment, the mixer 300 is a down mixer used in a direct conversion receiver. However, in another embodiment of the present invention, the mixer could also be an up mixer used in a direct conversion transmitter.

Figure 1:
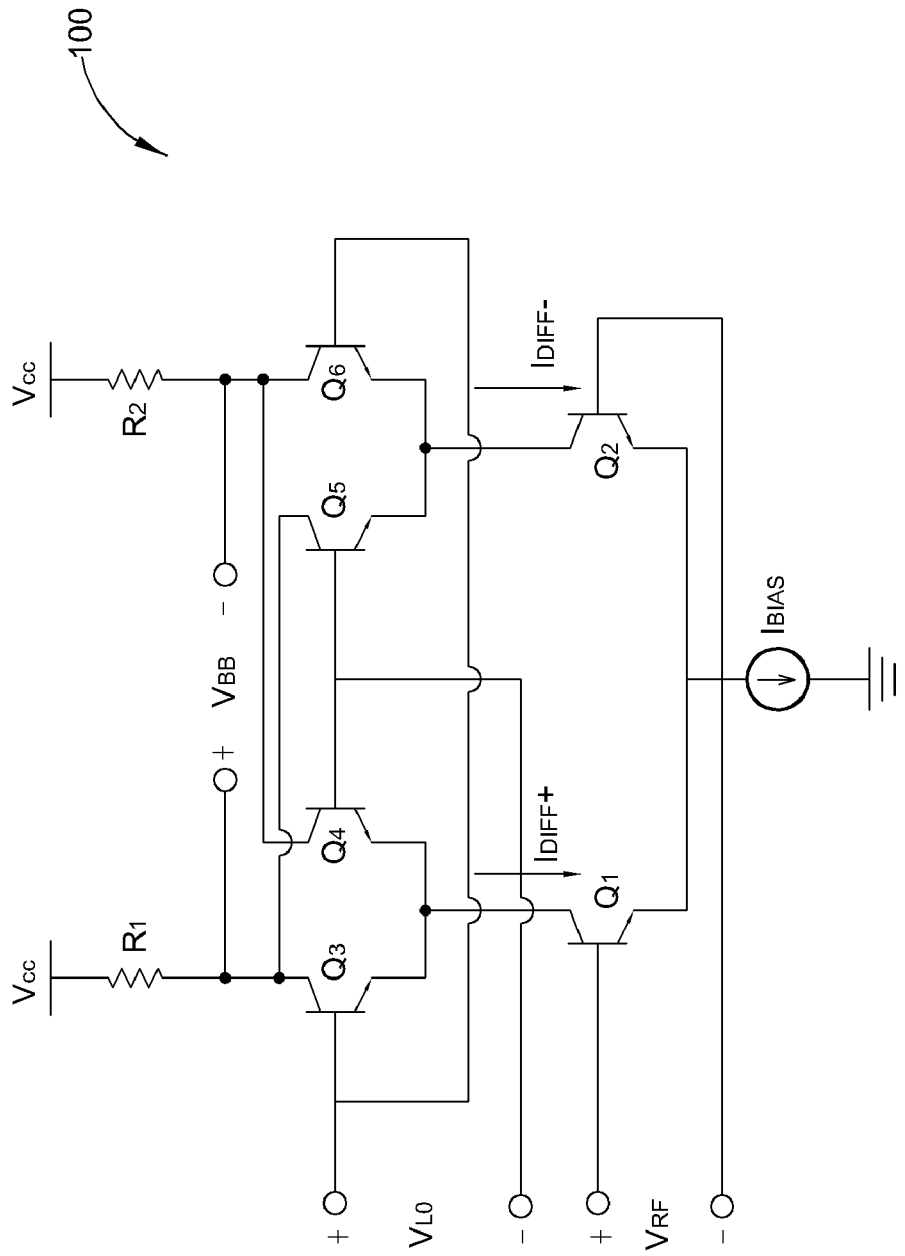
FIG. 1 shows a block diagram of a conventional double-balanced mixer used in a DCR.
Figure 2:
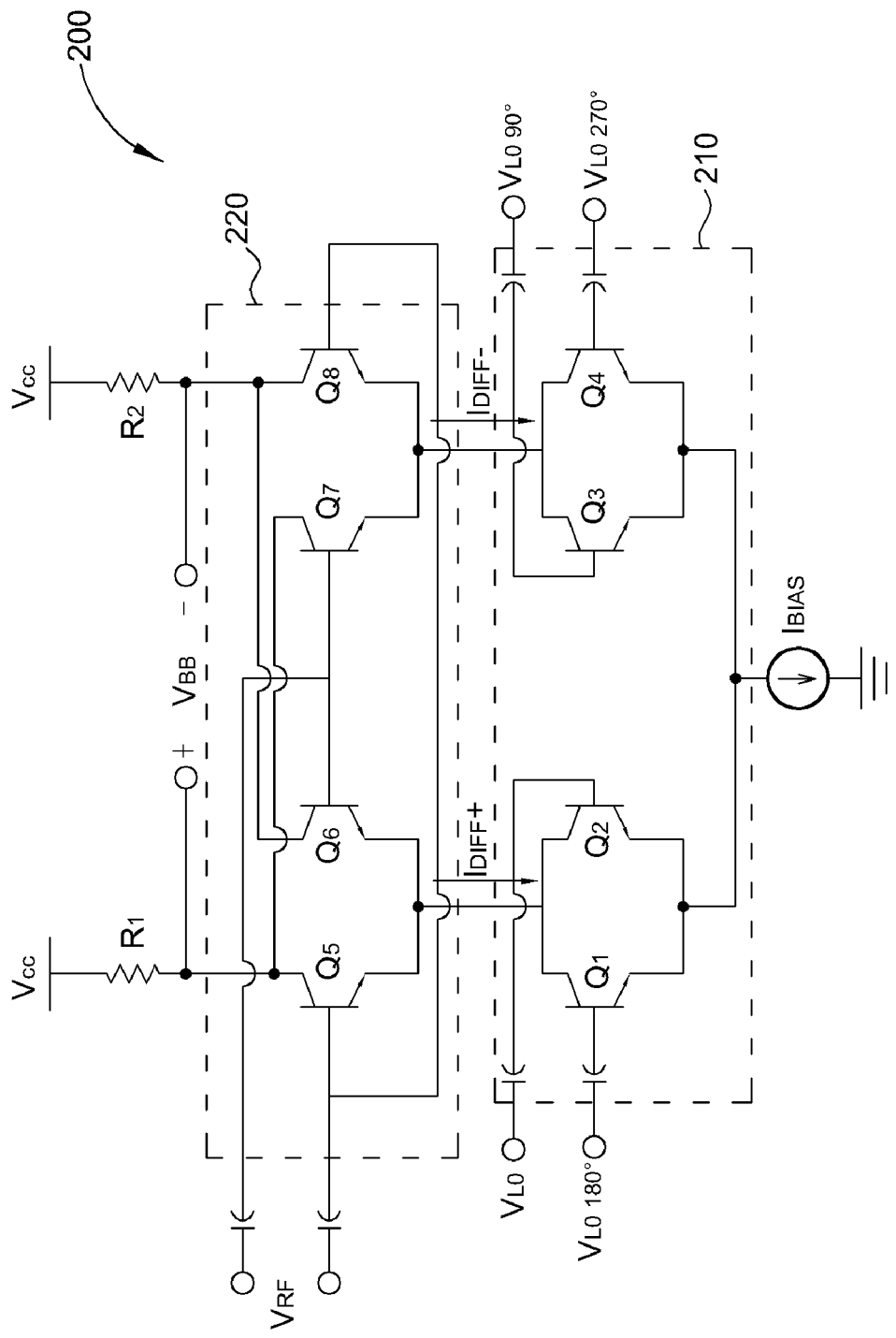
FIG. 2 shows a subharmonic double-balanced mixer disclosed by Rebeiz, et al. in U.S. Pat. No. 6,348,830.
Figure 4:
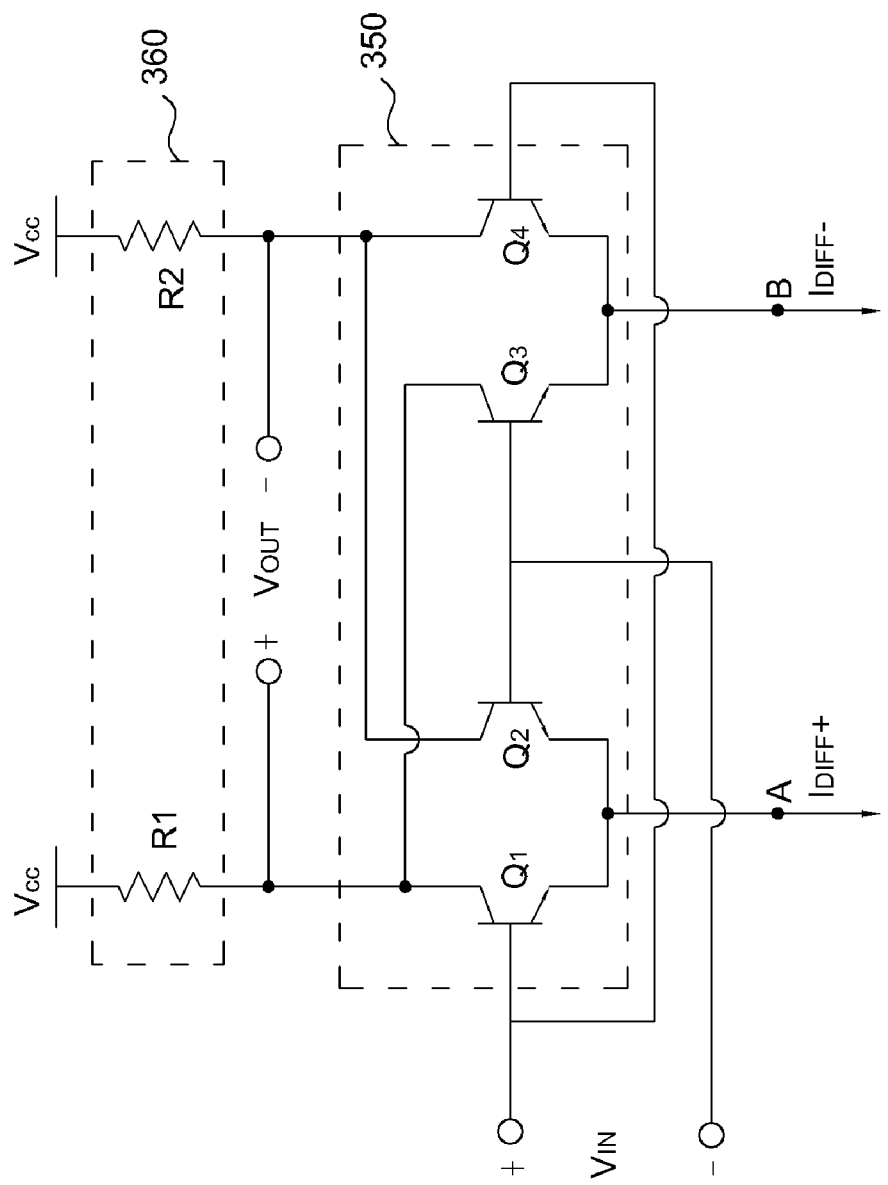
FIG. 4 shows a circuit diagram illustrating an example of the gm stage of FIG. 3.

Since the mixer 300 in this embodiment is a down mixer used in a direct conversion receiver, it converts an input signal $V_{IN}$ (which is an RF signal) having an input frequency $f_{IN}$ into an output signal $V_{OUT}$ (which is an IF signal or a baseband signal) having an output frequency $f_{OUT}$. The mixer 300 includes a local oscillator (LO) 310, a first divider 320, a second divider 330, a first multiplier 340, a gm stage 350, and a load circuit 360. The local oscillator 310 generates a preliminary local signal $LO_0$ (which is a voltage signal in this embodiment) having a basic frequency $f_{BASIC}$. The first divider 320 is electrically connected to the local oscillator 310 and divides the basic frequency $f_{BASIC}$ of the preliminary local signal $LO_0$ by a first divisor $N_1$ to obtain a first local signal $LO_1$ (which is a voltage signal in this embodiment) having a first frequency $f_1$, where $f_1 = f_{BASIC}/N_1$. The second divider 330 is electrically connected to the local oscillator 310 and divides the basic frequency $f_{BASIC}$ of the preliminary local signal $LO_0$ by a second divisor $N_2$ to obtain a second local signal $LO_2$ (which is also a voltage signal in this embodiment) having a second frequency $f_2$, where $f_2 = f_{BASIC}/N_2$. Both the first divisor $N_1$ and the second divisor $N_2$ could be integers. The first multiplier 340 is electrically connected to the first divider 320 and the second divider 330 and multiplies the first local signal $LO_1$ with the second local signal $LO_2$ to generate a differential current signal $I_{DIFF}$ having a third frequency $f_3$, where $f_3 = [(N_1+N_2)/N_1N_2] \times f_{BASIC}$ or $f_3 = [(N_1-N_2)/N_1N_2] \times f_{BASIC}$ (assume that $N_1 > N_2$). The unwanted frequency component $[(N_1-N_2)/N_1N_2] \times f_{BASIC}$ or $[(N_1+N_2)/N_1N_2] \times f_{BASIC}$ in the differential current signal $I_{DIFF}$ could be filtered by a filter (not shown) set between the first multiplexer 340 and the gm stage 350. Apparently, the function of the first divider 320, the second divider 330, and the first multiplier 340 as a whole is similar to the function of the LO section 210 of FIG. 2. In FIG. 2, the LO section 210 generates a differential current signal $I_{DIFF}$ according to the four LO signals. In FIG. 4, the first divider 320, the second divider 330, and the first multiplier 340 as a whole generates a differential current signal $I_{DIFF}$ according to a preliminary local signal $LO_0$.

Since in this embodiment the mixer 300 is a down mixer used in a direct conversion receiver, to avoid the LO self mixing problem, the basic frequency $f_{BASIC}$ of the preliminary local signal $LO_0$, the first frequency $f_1$ of the first local signal $LO_1$, and the second frequency $f_2$ of the second local signal $LO_2$ are all different from the input frequency $f_{IN}$ of the input signal $V_{IN}$. The third frequency $f_3$ of the differential current signal $I_{DIFF}$ is substantially the same as input frequency $f_{IN}$ of the input signal $V_{IN}$.

The function of the gm stage 350 is similar to that of the RF section of subharmonic double-balanced mixer 200 shown in FIG. 2. In FIG. 2, with the two resistors $R_1$ and $R_2$ being used as loads, the four transistors $Q_5 \sim Q_8$ mix the differential current signal $I_{DIFF}$ with the RF signal $V_{RF}$ to generate the output signal $V_{BB}$. In FIG. 3, with the load circuit 360, the gm stage 350 mixes the differential current signal $I_{DIFF}$ with the input signal $V_{IN}$ to generate the output signal $V_{OUT}$. More particularly, the gm stage 350 converts the input signal $V_{IN}$ having the input frequency $f_{IN}$ into the output signal $V_{OUT}$ having the output frequency $f_{OUT}$ according to the differential current signal $I_{DIFF}$ having the third frequency $f_3$. Since the third frequency $f_3$ of the differential current signal $I_{DIFF}$ is substantially the same as input frequency $f_{IN}$ of the input signal $V_{IN}$, the output frequency $f_{OUT}$ of the output signal $V_{OUT}$ will be substantially in baseband, so the follow-up demodulation and data reconstruction process would be performed on the resulted output signal $V_{OUT}$. An example of the gm stage 350 is the gm stage of a conventional Gilbert cell mixer, and an example of which is illustrated in FIG. 4. Since the operational principle of the gm stage shown in FIG. 4 is well known to a person skilled in the art, further explanation on the gm stage 350 will be omitted.

Please note that the if the mixer 300 is used in a direct conversion transmitter as an up mixer, the input frequency $f_{IN}$ of the input signal $V_{IN}$ would be in baseband, and the output frequency $f_{OUT}$ of the output signal $V_{OUT}$ will be substantially the same as the third frequency $f_3$ of the differential current signal $I_{DIFF}$. Besides, the basic frequency $f_{BASIC}$ of the preliminary local signal $LO_0$, the first frequency $f_1$ of the first local signal $LO_1$, and the second frequency $f_2$ of the second local signal $LO_2$ are all different from the output frequency $f_{OUT}$ of the output signal $V_{OUT}$. The third frequency $f_3$ of the differential current signal $I_{DIFF}$ is substantially the same as output frequency $f_{OUT}$ of the output signal $V_{OUT}$.

For implementing the first multiplier 340, which multiplies two voltage signals (the first local signal $LO_1$ and the second local signal $LO_2$) together to generate a current signal (the differential current signal $I_{DIFF}$), two documents could be referenced. One is "Low-Voltage BiCMOS Four-Quadrant Multiplier Using Triode-Region Transistors," IEEE Transactions on Circuits and Systems-I: Fundamental Theory and Applications, vol. 46, no. 7, July 1999, included herein by reference. The other one is "A Parallel Structure for CMOS Four-Quadrant Analog Multipliers and Its Application to a 2-GHz RF Downconversion Mixer," IEEE Journal of Solid-State Circuits, vol. 33, no. 6, June 1998, included herein by reference.

In a conventional mixer used in a direct conversion receiver or a direct conversion transmitter, the LO self-mixing problem or LO leakage problem occurs because the frequency of the local oscillating signal(s) (in voltage form) used by the mixer is substantially equal to the frequency of the input signal or the output signal of the mixer. However, in the exemplary embodiment of the present invention, the basic frequency $f_{BASIC}$ of the preliminary local signal $LO_0$, the first frequency $f_1$ of the first local signal $LO_1$, and the second frequency $f_2$ of the second local signal $LO_2$ are all different from the input frequency $f_{IN}$ of the input signal $V_{IN}$ (or different from the output frequency $f_{OUT}$ of the output signal $V_{IN}$ when the mixer 300 is an up mixer), hence the LO self-mixing problem (or the LO leakage problem) will be minimized. The differential current signal $I_{DIFF}$ still induces voltage swings with a frequency being substantially the same as the input frequency $f_{IN}$ of the input signal $V_{IN}$ occur at a node A and a node B of FIG. 4. However, since both these two nodes are low impedance points in the gm stage 350, voltage swings induced by the differential current signal $I_{DIFF}$ at these two nodes will be small, and the LO self-mixing problem (or the LO leakage problem) caused by the voltage swings at node A and B could be ignored.

Take a look at an example, assume that the first divisor $N_1$ is 4, the second divisor $N_2$ is 2, and the input signal $V_{IN}$ is a RF signal having the input frequency $f_{IN}$ lie between 1805~1990 MHz. Since the third frequency $f_3$ of the differential current signal $I_{DIFF}$ equals to $[(N_1+N_2)/N_1 N_2] \times f_{BASIC}=(3/4) \times f_{BASIC}$ and should be substantially the same as input frequency $f_{IN}$ of the input signal $V_{IN}$, $f_{BASIC}$ should be set as $(4/3) \times f_{IN}$ and lie between 2406.6~2653.3 MHz. An advantage of using '4' as the first divisor is that local signals used for the in-phase (I) channel and the quadrature (Q) channel could be generated at once easily.

Aside from the dividing scheme illustrated in FIG. 3, a multiplying scheme could also be used by the present invention. Under the multiplying scheme, the first divider 320 and the second divider 330 should be replaced by a second multiplier and a third multiplier respectively. Complying with the restrictions that basic frequency $f_{BASIC}$, the first frequency $f_1$, and the second frequency $f_2$ being all different from the input frequency $f_{IN}$ (or the output frequency $f_{OUT}$) and the third frequency $f_3$ being substantially the same as input frequency $f_{IN}$ (or the output frequency $f_{OUT}$), the second multiplier and the third multiplier multiply the basic frequency of the preliminary local signal with a second and a third multiplicator to obtain the first local signal having the first frequency and the second local signal having the second frequency respectively. Both a second multiplicator used by the second multiplier and a third multiplicator used by the third multiplier could be integers, and more particularly, the second multiplicator could be 4 and the third multiplicator could be 2.

Please note that in FIG. 3, the preliminary local signal $LO_0$, the first local signal $LO_1$, and the second local signal $LO_2$ could be single-ended or differential signals, and the gm stage 350 could have a single balance or a double balance structure accordingly, and the present invention is not limited by this disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency conversion apparatus for converting an input signal having an input frequency into an output signal having an output frequency, the frequency conversion apparatus comprising:
    a first multiplier for multiplying a first local signal having a first frequency with a second local signal having a second frequency to generate a differential current signal having a third frequency, wherein the third frequency is substantially the same as the input frequency or the output frequency, and the first frequency and the second frequency are different from the input frequency or the output frequency; and
    a gm stage electrically connected to the first multiplier, for receiving the differential current signal and the input signal to generate the output signal.

2. The frequency conversion apparatus of claim 1, further comprising:
    a local oscillator (LO) for generating a preliminary local signal having a basic frequency;
    a first divider electrically connected to the local oscillator and the first multiplier, for dividing the basic frequency of the preliminary local signal by a first divisor to obtain the first local signal having the first frequency; and
    a second divider electrically connected to the local oscillator and the first multiplier, for dividing the basic frequency of the preliminary local signal by a second divisor to obtain the second local signal having the second frequency.

3. The frequency conversion apparatus of claim 2, wherein the first divisor of the first divider and the second divisor of the second divider are integers.

4. The frequency conversion apparatus of claim 3, wherein the first divisor of the first divider is 4 and the second divisor of the second divider is 2.

5. The frequency conversion apparatus of claim 2, wherein the preliminary local signal, the first local signal, and the second local signal are voltage signals, and the basic frequency, the first frequency, and the second frequency are different from the input frequency of the input signal or the output frequency of the output signal.

6. The frequency conversion apparatus of claim 1, further comprising:
    a local oscillator (LO) for generating a preliminary local signal having a basic frequency;
    a second multiplier electrically connected to the local oscillator and the first multiplier, for multiplying the basic frequency of the preliminary local signal with a second multiplicator to obtain the first local signal having the first frequency; and
    a third multiplier electrically connected to the local oscillator and the first multiplier, for multiplying the basic frequency of the preliminary local signal with a third multiplicator to obtain the second local signal having the second frequency.

7. The frequency conversion apparatus of claim 6, wherein the second multiplicator of the second multiplier and the third multiplicator of the third multiplier are integers.

8. The frequency conversion apparatus of claim 6, wherein the second multiplicator of the second multiplier is 4 and the third multiplicator of the third multiplier is 2.

9. The frequency conversion apparatus of claim 6, wherein the preliminary local signal, the first local signal, and the second local signal are voltage signals, and the basic frequency, the first frequency, and the second frequency are different from the input frequency of the input signal or the output frequency of the output signal.

10. The frequency conversion apparatus of claim 1, further comprising:
    a filter electrically connected between the first multiplier and the gm stage, for filtering out an unwanted frequency of the differential current signal.

11. The frequency conversion apparatus of claim 1, wherein the input signal and the output signal are differential signals, the gm stage comprises:
    a first transistor pair electrically connected to the first multiplier, for generating a first single-ended output signal of the output signal according to the input signal and a first single-ended current signal of the differential current signal; and a second transistor pair electrically connected to the first multiplier, for generating a second single-ended output signal of the output signal according to the input signal and a second single-ended current signal of the differential current signal.

12. A method for converting an input signal having an input frequency into an output signal having an output frequency, the method comprising:

multiplying a first local signal having a first frequency with a second local signal having a second frequency to generate a differential current signal having a third frequency, wherein the third frequency is substantially the same as the input frequency or the output frequency, and the first frequency and the second frequency are different from the input frequency or the output frequency; and receiving the differential current signal and the input signal to generate the output signal.

13. The method of claim 12, further comprising:

generating a preliminary local signal having a basic frequency;

dividing the basic frequency of the preliminary local signal by a first divisor to obtain the first local signal having the first frequency; and dividing the basic frequency of the preliminary local signal by a second divisor to obtain the second local signal having the second frequency.

14. The method of claim 13, wherein the first divisor and the second divisor are integers.

15. The method of claim 13, wherein the first divisor is 4 and the second divisor is 2.

16. The method of claim 13, wherein the preliminary local signal, the first local signal, and the second local signal are voltage signals, and the basic frequency, the first frequency, and the second frequency are different from the input frequency of the input signal or the output frequency of the output signal.

17. The method of claim 12, further comprising:

generating a preliminary local signal having a basic frequency;

multiplying the basic frequency of the preliminary local signal with a second multiplicator to obtain the first local signal having the first frequency; and multiplying the basic frequency of the preliminary local signal with a third multiplicator to obtain the second local signal having the second frequency.

18. The method of claim 17, wherein the second multiplicator and the third multiplicator are integers.

19. The method of claim 17, wherein the second multiplicator is 4 and the third multiplicator is 2.

20. The method of claim 17, wherein the preliminary local signal, the first local signal, and the second local signal are voltage signals, and the basic frequency, the first frequency, and the second frequency are different from the input frequency of the input signal or the output frequency of the output signal.

21. The method of claim 12, further comprising:

filtering out an unwanted frequency of the differential current signal before it get into the receiving step.

* * * * *